(12) United States Patent
Chida

(10) Patent No.: US 8,095,016 B2
(45) Date of Patent: Jan. 10, 2012

(54) BIDIRECTIONAL, OPTICAL TRANSMITTING/RECEIVING MODULE, OPTICAL TRANSMITTING/RECEIVING DEVICE, AND BIDIRECTIONAL OPTICAL TRANSMITTING/RECEIVING MODULE MANUFACTURING METHOD

(75) Inventor: Hiroaki Chida, Tokyo (JP)

(73) Assignee: NEC Corporation, Tokyo (JP)

( * ) Notice: Subject to any disclaimer, the term of this patent is extended or adjusted under 35 U.S.C. 154(b) by 804 days.

(21) Appl. No.: 12/016,345

(22) Filed: Jan. 18, 2008

(65) Prior Publication Data
US 2008/0181611 A1 Jul. 31, 2008

(30) Foreign Application Priority Data
Jan. 30, 2007 (JP) ................................. 2007-020127
Jan. 10, 2008 (JP) ................................. 2008-003194

(51) Int. Cl.
*H04B 10/00* (2006.01)
(52) U.S. Cl. ......... 398/139; 398/135; 398/138; 398/164
(58) Field of Classification Search .................... 385/14, 385/15, 31, 49, 42, 88, 89, 92, 129, 130, 385/131, 132; 398/135, 138, 139, 128, 130, 398/141, 142, 164, 79; 438/29, 31
See application file for complete search history.

(56) References Cited

U.S. PATENT DOCUMENTS

| 5,633,962 | A * | 5/1997 | Kurata ............................. 385/24 |
| 5,787,214 | A * | 7/1998 | Harpin et al. .................... 385/49 |
| 7,486,846 | B2 * | 2/2009 | Warashina et al. ............. 385/14 |
| 2001/0028768 | A1 * | 10/2001 | Terashima ....................... 385/49 |
| 2004/0126118 | A1 * | 7/2004 | Lo et al. ........................ 398/139 |
| 2004/0175075 | A1 * | 9/2004 | Takahashi et al. ............... 385/50 |
| 2007/0019036 | A1 * | 1/2007 | Deguchi .......................... 347/54 |
| 2007/0262327 | A1 * | 11/2007 | Shimooka ....................... 257/79 |

FOREIGN PATENT DOCUMENTS

| JP | 2002031748 | A |   | 1/2002 |
| JP | 2003215371 | A |   | 7/2003 |
| JP | 2004287186 | A | * | 10/2004 |
| JP | 2006133569 | A | * | 5/2006 |
| WO | 9811460 | A1 |  | 3/1998 |

* cited by examiner

*Primary Examiner* — M. R. Sedighian

(57) ABSTRACT

To provide a low-cost and fine-property bidirectional optical transmitting/receiving module and the like, which include a de-multiplexing device that uses a V-letter shaped optical waveguide and a dielectric multilayer filter. Formation of an end face where the dielectric multilayer film is formed and separation of optical modules are performed in separate steps, and the end face at the intersection of the V-letter shaped optical waveguide, on which the dielectric multilayer filter is formed, is formed by dry etching to achieve high smoothness. Further, a cutting face of the optical module is set at a position that is isolated from the end face at least by 3 μm. Through the above, the smooth end face is protected from roughness of the cutting face caused by a light emitting element separating step, and the dielectric multilayer filter is formed on that end face.

13 Claims, 17 Drawing Sheets

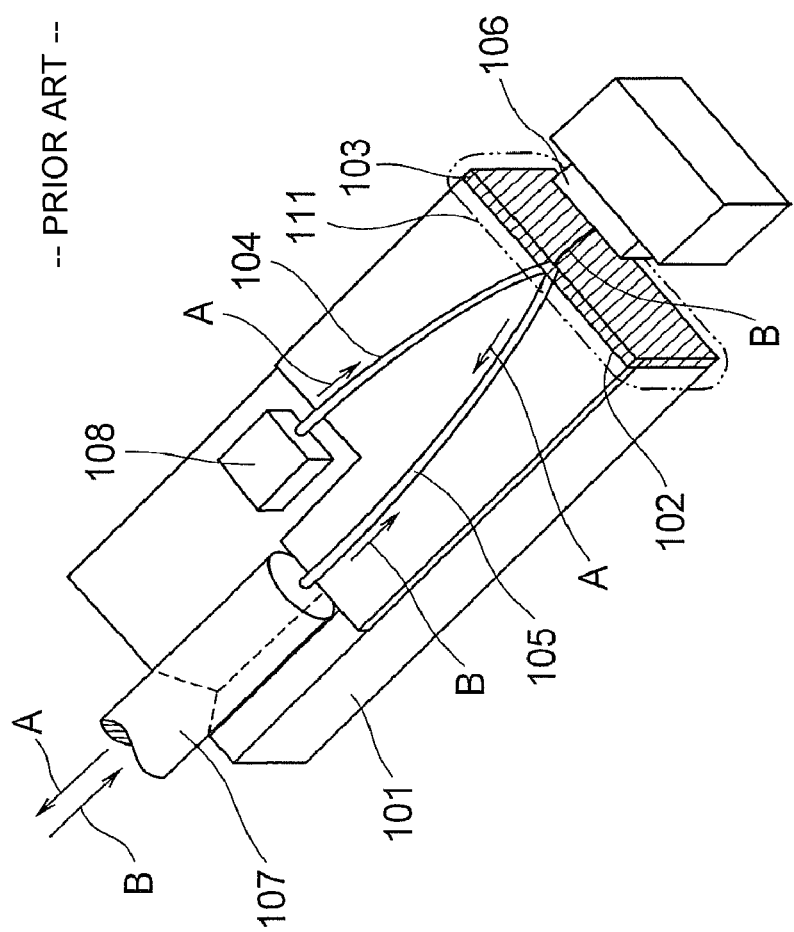
FIG.16 -- PRIOR ART --

US 8,095,016 B2

BIDIRECTIONAL, OPTICAL TRANSMITTING/RECEIVING MODULE, OPTICAL TRANSMITTING/RECEIVING DEVICE, AND BIDIRECTIONAL OPTICAL TRANSMITTING/RECEIVING MODULE MANUFACTURING METHOD

CROSS-REFERENCE TO RELATED APPLICATION

This application is based upon and claims the benefit of priority from Japanese patent application No. 2007-020127, filed on Jan. 30, 2007 and Japanese patent application No. 2008-003194, filed on Jan. 10, 2008, the disclosure of which is incorporated herein in its entirety by reference.

BACKGROUND OF THE INVENTION

1. Field of the Invention

The present invention relates to a bidirectional optical transmitting/receiving module. More specifically, it relates to a low-cost bidirectional optical transmitting/receiving module as well as an optical transmitting/receiving device having a high-performance de-multiplexing characteristic, and to a method for manufacturing the bidirectional optical transmitting/receiving device.

2. Description of the Related Art

There has been proposed a bidirectional optical transmitting/receiving module that bidirectionally transmits light of two different wavelengths through a single-core optical fiber so as to perform bidirectional communications simultaneously. For example, as shown in FIG. 16 (corresponds to FIG. 1 of Japanese Unexamined Patent Publication 2004-287186 (Patent Document 1)), the bidirectional optical transmitting/receiving module includes: an optical waveguide substrate 101; a first optical waveguide 104 and a second optical waveguide 105 arranged in a V-letter shape on the optical waveguide substrate 101; an end face 102 formed with its cutting face being almost perpendicular to the intersection part (the right end part in FIG. 16) of the first and second waveguides 104 and 105; and a multilayer optical filter 103 provided while being abutted against the end face 102.

Further, this bidirectional optical transmitting/receiving module includes: an optical fiber 107 that is connected to the outer end face of the second waveguide 105; a light receiving part (light receiving element) 106 arranged to face the multilayer optical filter 103; and a light emitting element 108 that is optically connected to the outer end face of the first optical waveguide 104. Reference numeral 111 is an optical resin layer.

First, considering first wavelength light A in the module shown in FIG. 16, the first wavelength light A emitted from the light emitting element 108 to the first optical waveguide 104 is reflected at the multilayer optical filter 103, and is sent out to the optical fiber 107 through the second optical waveguide 105. Then, when second wavelength light B makes incident on the second optical waveguide 105 via the optical fiber 107, the second wavelength light B transmits through the multilayer optical filter 103 and reaches the light receiving part 106 where it is converted to an electric signal and detected.

In this manner described above, bidirectional communications can be performed with a single-core optical fiber by using two kinds of light with different wavelengths. In this case, the multilayer optical filter 103 executes such selective actions (de-multiplexing characteristic of the multilayer optical filter 103) based on a difference in terms of the wavelengths that the first wavelength light A is not transmitted but reflected, and the second wavelength light B is not reflected but transmitted. When the de-multiplexing characteristic of the multilayer optical filter 103 becomes shifted from the ideal characteristic, an interference (cross-talk) is induced when performing transmission and reception of light, such as transmission of unnecessary first wavelength light A. Therefore, the de-multiplexing characteristic is an important characteristic for the performance of the module.

Further, in a bidirectional optical transmitting/receiving module shown in FIG. 17 (corresponds to FIG. 1 of Japanese Unexamined Patent Publication 2002-31748 (Patent Document 2)), a clad layer 203 is provided on an optical waveguide substrate 201, a V-letter shaped optical waveguide 223 is disposed in the center of the clad layer 203 along the optical waveguide substrate 201, and a dielectric multilayer filter 214 is provided to be in contact with the intersection part of the V-letter shaped optical waveguide 223 that is disposed at a top end face, thereby forming a de-multiplexing unit (FIG. 17A). Reference numeral 215 is a solder film. The de-multiplexing unit disclosed in FIG. 17A is stacked on a unit shown in FIG. 17B. Reference numeral 204 indicates an alignment mark.

FIG. 17B shows the other unit (on the right side of the drawing) that holds the de-multiplexing unit described above. These units are combined to form the bidirectional optical transmitting/receiving module.

The unit shown in FIG. 17B is assembled as follows. An alignment area for placing the above-described de-multiplexing unit is provided on the near side on a multimode linear optical waveguide substrate 251, an over clad layer 233 is laminated on the far side on the multimode linear optical waveguide substrate 251, a linear optical waveguide 221a is enclosed inside thereof, and a 1310-nm cutoff multilayer filter 214a is provided at the end face on the far side of the over clad layer 233. Further, a receiving photodiode 210 and a sub-mount 252 are stacked in order by facing the 1310-nm cutoff multilayer filter 214a.

In the case of FIG. 17, practically, towards the front side of the linear optical waveguide substrate 251 of FIG. 17, the linear optical waveguide substrate 251 itself is extended and an optical fiber and a light emitting element to be engaged with the V-letter shaped optical waveguide 223 are mounted in that extended area. That is, in this case, the other unit (right side of the drawing) including a V-letter shaped groove for fixing the optical fiber is combined therewith to form the bidirectional optical transmitting/receiving module. As in the case of FIG. 16 described above, this case also uses the dielectric multilayer filter 214a that executes selective actions depending on the wavelengths. Reference numeral 207 is a dicing groove, 212 is a recessed part, 215a is a solder film, and 204 is an alignment mark.

Even though the structures of the optical transmitting/receiving modules of the above-described two related techniques are different from each other, the dielectric multilayer filters thereof are assumed to be formed directly on the dicing face at which the optical waveguide substrate is diced because the forming method thereof is not specifically disclosed. In that case, it is often difficult for the dielectric multilayer filter formed on the dicing face to avoid influences of a roughness generated on the dicing face at the time of dicing. Therefore, a sufficient de-multiplexing characteristic cannot be obtained.

SUMMARY OF THE INVENTION

An exemplary object of the present invention therefore is to provide a bidirectional optical transmitting/receiving module, an optical transmitting/receiving device, and a method for manufacturing the optical transmitting/receiving module, which make it possible to avoid influences of the roughness on the cutting face generated in a separating step of the bidirectional optical transmitting/receiving module to be imposed upon a de-multiplexing characteristic, and make it possible to obtain a desired de-multiplexing characteristic stably with a simple-structured and low-cost manufacturing method.

In order to achieve the foregoing exemplary object, a bidirectional optical transmitting/receiving module according to an exemplary aspect of the invention includes: a light emitting element for performing simultaneous bidirectional communications with light of two wavelengths by using a single-core optical fiber; a bidirectional optical waveguide which is formed on a substrate and coupled to the light emitting element; and a dielectric multilayer filter formed on a folded-structured end face of the optical waveguide, the dielectric multilayer filter having a characteristic of reflecting transmitted light from the light emitting element and a characteristic of transmitting received light from outside, wherein the folded-structured end face of the optical waveguide is disposed at a position receded to an inner side with respect to an end face of the substrate.

A bidirectional optical transmitting/receiving module according to an exemplary aspect of the invention includes: a bidirectional optical transmitting/receiving module; a light emitting element drive control device for drive-controlling, with a transmission electric signal from outside, a light emitting element that inputs an optical signal to the bidirectional optical transmitting/receiving module; and a received signal output device for outputting, to the outside, a received signal that is obtained by photoelectrically converting the optical signal received at a light receiving element from the bidirectional optical transmitting/receiving module, wherein the bidirectional optical transmitting/ receiving module includes: a light emitting element for performing simultaneous bidirectional communications with light of two wavelengths by using a single-core optical fiber; a bidirectional optical waveguide which is formed on a substrate and coupled to the light emitting element; and a dielectric multilayer filter formed on a folded-structured end face of the optical waveguide, the dielectric multilayer filter having a characteristic of reflecting transmitted light from the light emitting element and a characteristic of transmitting received light from outside, wherein the folded-structured end face of the optical waveguide is disposed at a position receded to an inner side with respect to an end face of the substrate.

A bidirectional optical transmitting/receiving module manufacturing method according to still another exemplary aspect of the invention includes: forming a bidirectional optical waveguide on a substrate; and forming an end face that is perpendicular to the optical waveguide with respect to a position of a folded structure of the optical waveguide, at a position that is receded to an inner side from an end face of the substrate.

As an exemplary advantage according to the invention, it is possible to form a smooth end face. Thus, the dielectric multilayer filter formed thereon comes to have a high-performance de-multiplexing characteristic. Therefore, it is possible to provide a high-performance bidirectional optical transmitting/receiving module with which the transmitted light is not mixed with the received light. Further, it is also possible to provide a bidirectional optical transmitting/receiving device using such module, and to provide a simple-structured and low-cost manufacturing method of the bidirectional optical transmitting/receiving module stably.

BRIEF DESCRIPTION OF THE DRAWINGS

FIG. 16 is a perspective view showing an example of a related technique; and

EXEMPLARY EMBODIMENTS

Now, an exemplary embodiment of the present invention will be described by referring to FIG. 1.

Figure 1:
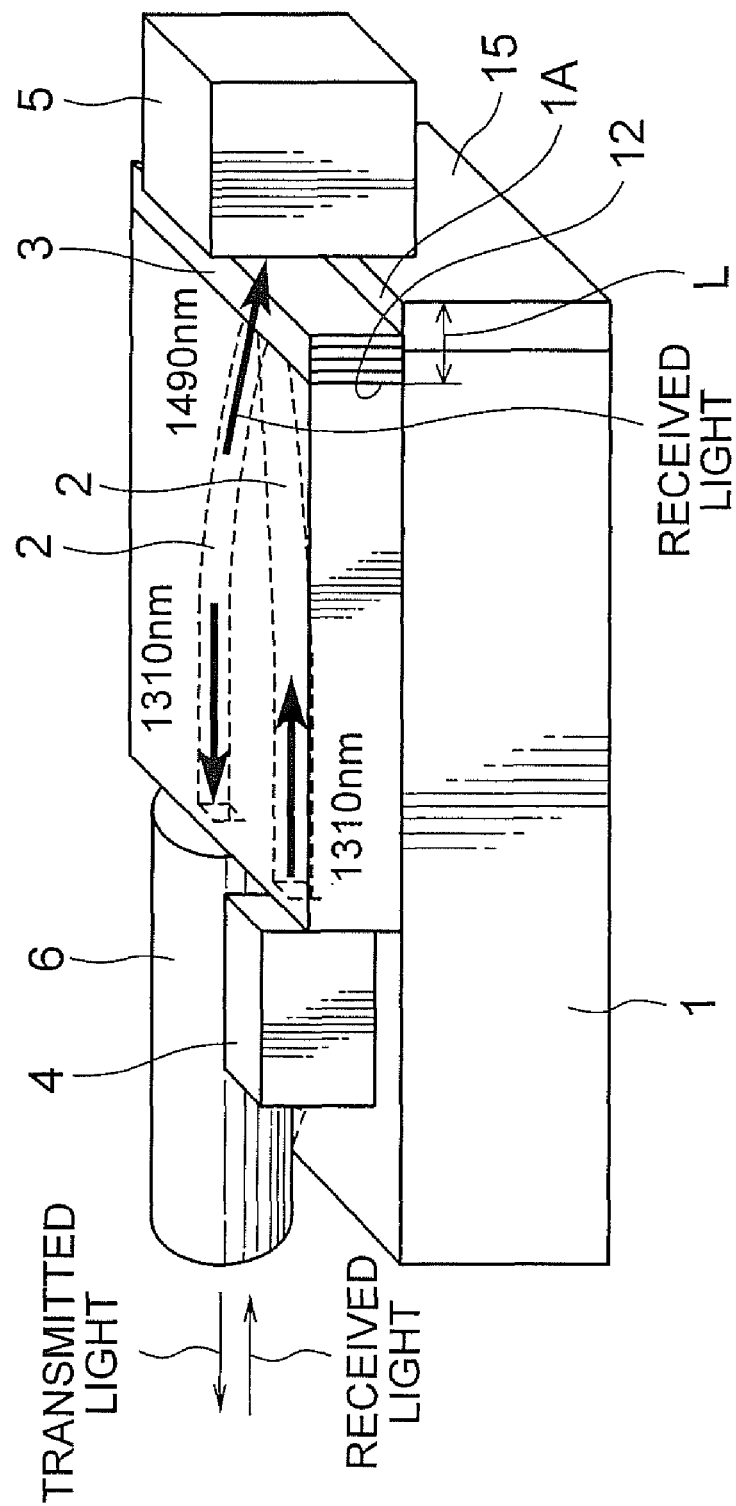
FIG. 1 is a perspective view (schematic illustration) showing a bidirectional optical transmitting/receiving module according to an exemplary embodiment of the present invention.

In FIG. 1, a bidirectional optical transmitting/receiving module according to this exemplary embodiment includes: an Si substrate 1, for example; a semiconductor laser 4 as a light emitting element for enabling simultaneous bidirectional communications with light of two wavelengths by using a single-core optical fiber, and a V-letter shaped optical waveguide 2 engaged with the semiconductor laser (light emitting element) 4, which are mounted on the substrate 1; and a dielectric multilayer filter 3 that is a dielectric multi-layer film having a characteristic of reflecting transmitted light from the semiconductor laser (light emitting element) 4 and a characteristic of transmitting the light received from the outside, which is provided over an end face 12 at the intersection part of the V-letter shaped optical waveguide 2.

In this bidirectional optical transmitting/receiving module, further, the end face 12 located at the intersection part of the V-letter shaped optical waveguide 2 is formed by etching, and a dicing face 15 of the substrate 1 is formed at a position that is protruded from the end face 12 towards the outer side on the same flank of the end face 12. The end face 12 and the dicing face 15 are provided at positions shifted from each other by the width of a step structure 1A.

Therefore, unlike the method which simultaneously performs dicing of the substrate and forming of the end face, the end face 12 can be formed smoothly by etching. In addition, the step structure 1A is formed so that a dicing tool does not make a contact with the end face 12 at the time of dicing the substrate, thereby preventing the dicing tool from making a contact with the end face 12 at the time of dicing. Therefore, it is possible for the end face 12 to effectively avoid roughness generated thereon at the time of processing, so that adverse effects imposed upon the de-multiplexing characteristic can be avoided. As a result, it is possible to form a high-quality dielectric multilayer film (the dielectric multilayer filter 3), so that a desired de-multiplexing characteristic can be obtained stably with a simple-structured and low-cost manufacturing method.

This will be described in more details hereinafter. FIG. 1 schematically shows the bidirectional optical transmitting/receiving module that has a function of performing bidirectional communications with a single-core optical fiber by using two kinds of light with different wavelengths (1310 nm, 1490 nm).

Reference numeral 1 is the Si substrate. The V-letter shaped optical waveguide 2 with a rectangular cross section is formed on the Si substrate 1. At the intersection part of optical waveguides 2, 2 formed into the V-letter shape waveguide 2, the smooth end face 12 is formed. The dielectric multilayer filter 3 is formed on the end face 12. Further, the end face 12 is disposed at a position receded (retracted) from the end face 15 of the substrate 1 by a distance L.

The semiconductor laser (light source) 4 as a light emitting element is optically coupled to one end of the one of the optical waveguides 2, 2 formed into the V-letter shaped optical waveguide 2, and an optical fiber 6 is optically coupled to the other end of the other optical waveguide 2. Further, a photodiode 5 as a light receiving element, which is attached to the end face 15 of the substrate 1, is disposed on the dielectric multilayer filter 3 that is formed at the intersection part of the V-letter shaped optical waveguide 2.

The V-letter shaped optical waveguide 2 includes, on the Si substrate 1, at least a lower clad layer (refractive index n1), a core layer (refractive index n2), and an upper clad layer (refractive index n3) in order, which are structured as V-letter shaped optical waveguide having a rectangular cross section with which propagation of light in the lateral direction is suppressed. The relation between the refractive indexes of each layer can be expressed as $n1<n2$, and $n2>n3$.

The dielectric multilayer filter 3 is formed by a thin film forming technique on the perpendicular end face 12 located at the intersection part of the V-letter shaped optical waveguide 2 so as to have a de-multiplexing function for reflecting one of the two kinds of light with different wavelengths and for transmitting the other. If there is a roughness generated on the end face 12, this de-multiplexing characteristic becomes deteriorated. Thus, transmitted light is mixed into weak received light, thereby deteriorating a receiving S/N (signal-to-noise ratio) characteristic of the bidirectional optical transmitting/receiving module.

Therefore, in this exemplary embodiment, an optical waveguide end face forming step is provided separately from an optical transmitting/receiving module separating step, unlike the related technique in which the optical waveguide end face forming step and the optical transmitting/receiving module separating step are provided uniformly as a single separating (dicing) step.

That is, the smooth end face 12 is formed first by dry etching at the position where the above-described optical waveguides intersect with each other. Thereafter, the optical transmitting/receiving module substrate 1 is separated in such a manner that the dicing tool does not make a contact with the end face 12. That is, the end face 12 is disposed at a position that is receded (retracted) from the end face 15 of the substrate 1 by the distance L. Specifically, at least about 3 μm (or more) of the step structure 1A is provided between the end face 12 and the end face 15 that is a separating (dicing) face of the substrate 1 (see FIG. 7). The structure including the step structure 1A makes it possible to prevent the end face 12 from becoming a rough surface that may be caused because the dicing tool makes a contact with the end face 12 at the time of dicing the substrate 1.

Next, actions of the above-described bidirectional optical transmitting/receiving module will be described. First, for the light with the wavelength of 1310 nm as the transmitted light, the light with the wavelength of 1310 nm is emitted from the semiconductor laser 4 as the light emitting element towards the one of the optical waveguides 2, 2 formed in to the V-letter shaped optical waveguide 2, it is reflected at the dielectric multilayer filter 3 and transmitted to the optical fiber 6 through the other optical waveguide 2.

Then, when the light with the wavelength of 1490 nm makes incident on the other optical waveguide 2 formed into the V-letter shaped optical waveguides 2 via the optical fiber 6, the light transmits through the dielectric multilayer filter 3 and reaches the photodiode 5 as a light receiving part where it is converted into an electric signal and detected. At this time, if the light with the wavelength of 1310 nm is not entirely reflected at the dielectric multilayer filter 3 and is transmitted therethrough, it enters the photodiode 5 along with the light with the wavelength of 1490 nm that is originally the light to be received. This generates an interference noise, which deteriorates the characteristic of the optical module. Therefore, the structure that is peculiar to the above-described exemplary embodiment is employed to maintain a high-performance de-multiplexing characteristic and a high received light quality.

The same optical transmitting/receiving module as that of the above-described bidirectional optical transmitting/receiving module can be used for the optical transmitting/receiving device of the other party (communication partner). However, in that case, it is necessary for the dielectric multilayer filter on the other party to have an "inverted characteristic" in terms of the de-multiplexing characteristic, i.e. a characteristic that transmits the light with the wavelengths of 1310 nm and reflects the light with the wavelength of 1490 nm.

In the bidirectional optical transmitting/receiving module with the above-described structure, the optical transmitting/receiving module separating step and the end face forming step for forming the end face at the intersection part of the optical waveguides are executed separately, and the step structure is provided. That is, the end face 12 located at the intersection part of the V-letter shaped optical waveguide 2 is disposed at a position that is recessed from the end face 15 of the substrate 1 so as to avoid the influence of dicing on the end face 12 at the time of dicing the end face 15 of the substrate 1. Therefore, the de-multiplexing characteristic of the dielectric multilayer filter formed on the end face 12 can be improved dramatically, which makes it possible to obtain an excellent characteristic as the bidirectional optical transmitting/receiving module.

(Manufacturing Method)

Next, a manufacturing method of the bidirectional optical transmitting/receiving module according to the exemplary embodiment will be described by referring to FIG. 2-FIG. 13.

Figure 2:
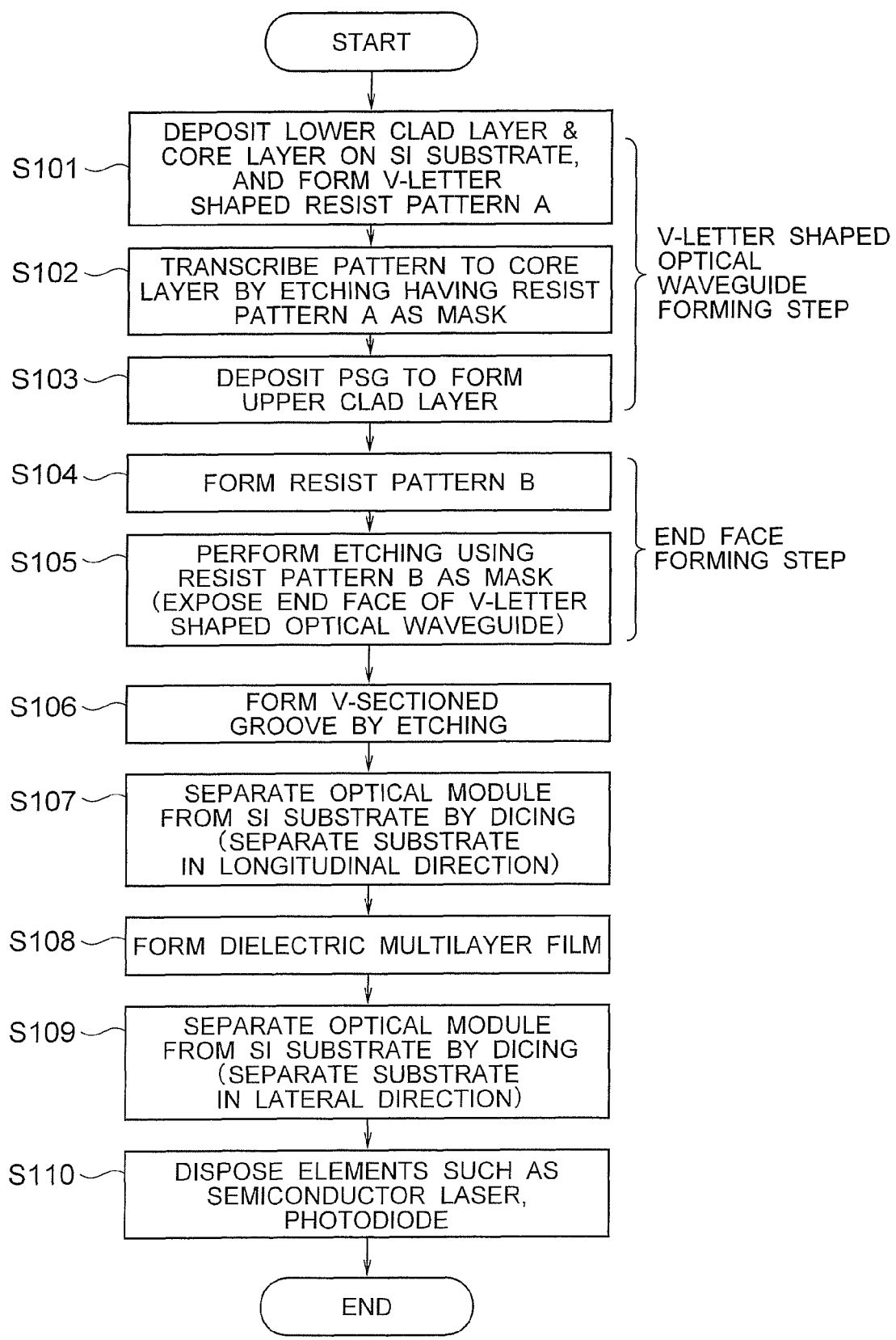
FIG. 2 is a flowchart showing a procedure for manufacturing the bidirectional optical transmitting/receiving module disclosed in FIG. 1.

FIG. 2 is a flowchart showing each step of the method for manufacturing the bidirectional optical transmitting/ receiving module. Further, FIG. 3-FIG. 12 are schematic views which correspond to each step shown in FIG. 2.

The method for manufacturing the above-described includes: first, a waveguide forming step for forming the V-letter shaped optical waveguide 2 on the substrate (silicon substrate: Si substrate) 1; an end face forming step for forming, by etching, the end face 12 that is perpendicular to the formed V-letter shaped optical waveguide 2 at the intersection part of the V-letter shaped optical waveguide 2; a dicing processing step for performing dicing processing on the substrate 1 at a position that is extruded towards the outer side from the end face 12 and is also on the same flank of the end face 12; and, after the dicing processing, a dielectric multilayer film forming step for forming, on the end face 12, the dielectric multilayer film (the dielectric multilayer filter) 3 which reflects the transmitted light wavelength and transmits the received light wavelength.

Unlike the manufacturing method which simultaneously performs dicing of the substrate and forming of the end face, this method forms the end face by etching. Thus, the end face formed thereby becomes smooth. Further, dicing of the substrate is performed after forming the step structure so that the dicing tool does not make a contact with the end face. Therefore, influences imposed upon the de-multiplexing characteristic can be avoided even if the cutting face has roughness, so that a high-quality dielectric multilayer film can be formed. As a result, the optical transmitting/receiving module having a desired de-multiplexing characteristic can be obtained stably with a simple structure and at a low cost.

Note here that the method may be structured such that: only slight dicing is performed in the above-described dicing processing step to such an extent that the substrate 1 is not separated; the dielectric multilayer film 3 is formed by wafer collective processing in the dielectric multilayer film forming step; and a complete separation step is executed thereafter (see FIG. 13).

As in the above-described case, the manufacturing procedure of the bidirectional optical transmitting/receiving module may include: first, a waveguide forming step for forming the V-letter shaped optical waveguide 2 on the substrate 1; an end face forming step for forming, by etching, the end face 12 (right-side face of FIG. 7) that is perpendicular to the V-letter shaped optical waveguide 2 at the intersection part of the V-letter shaped optical waveguide 2; a dielectric multilayer film forming step for forming, on the end face 12 by wafer collective processing, the dielectric multilayer film 3 which reflects the transmitted light wavelength and transmits the received light wavelength; and a dicing processing step for performing dicing processing on the substrate 1 at a position that is extruded towards the outer side from the end face 12 and is also on the same flank of the end face 12.

This will be described in more details hereinafter.

First, the V-letter shaped optical waveguide 2 is formed through the procedure from step S101 to step S103 of FIG. 2 (V-letter shaped optical waveguide forming step A).

Figure 3:
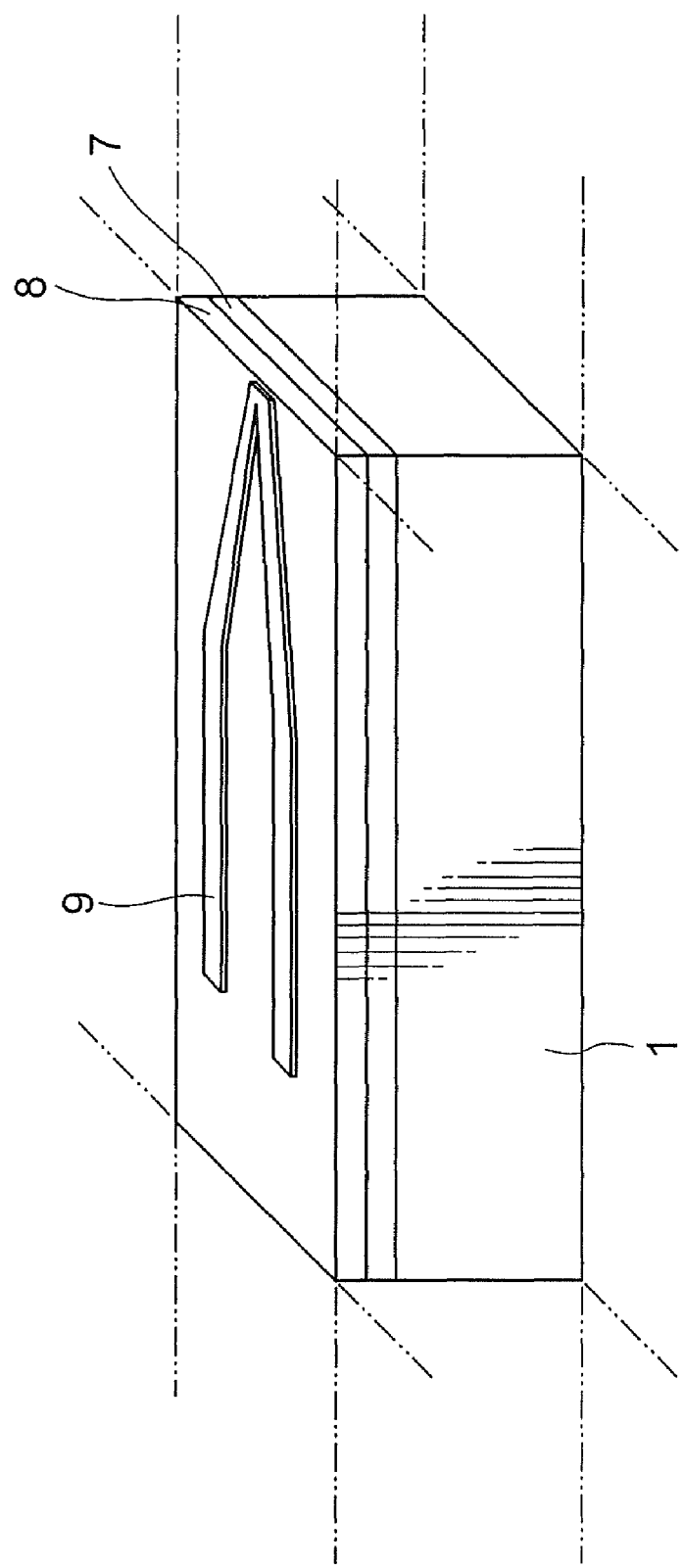
FIG. 3 is an illustration for describing a V-letter type waveguide forming step 1 that is a pre-step in the flowchart of FIG. 2 that shows the procedure for manufacturing the bidirectional optical transmitting/receiving module.

That is, as shown in FIG. 3, PSG (phosphorous-added silica glass) and GPSG (germanium/phosphorous-added glass) are deposited on the Si substrate 1 in order to form the lower clad layer 7 (refractive index n1) and the core layer 8 (refractive index n2) and, further, a resist pattern A9 is formed at a position where the V-letter shaped waveguide 2 including a rectangular core section is to be formed (V-letter shaped optical waveguide forming step 1: pre-step, step S101).

Figure 4:
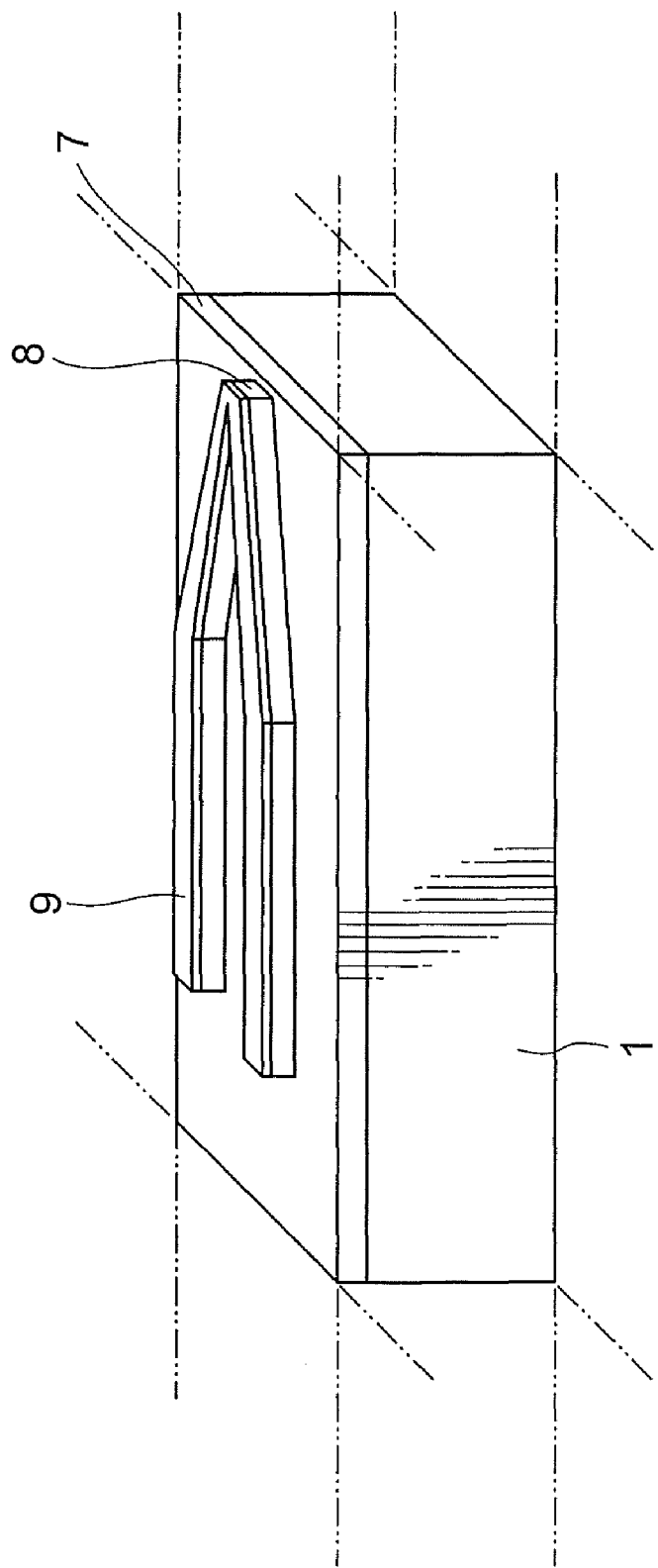
FIG. 4 is an illustration for describing a V-letter type waveguide forming step 2 (a core forming step) in the flowchart of FIG. 2 that shows the procedure for manufacturing the bidirectional optical transmitting/receiving module.

Next, a pattern is transcribed to the core of the V-letter shaped optical waveguide 2 through performing dry etching by having the resist pattern A9 as a mask as shown in FIG. 4 (V-letter shaped optical waveguide forming step B: core forming step, step S102).

Figure 5:
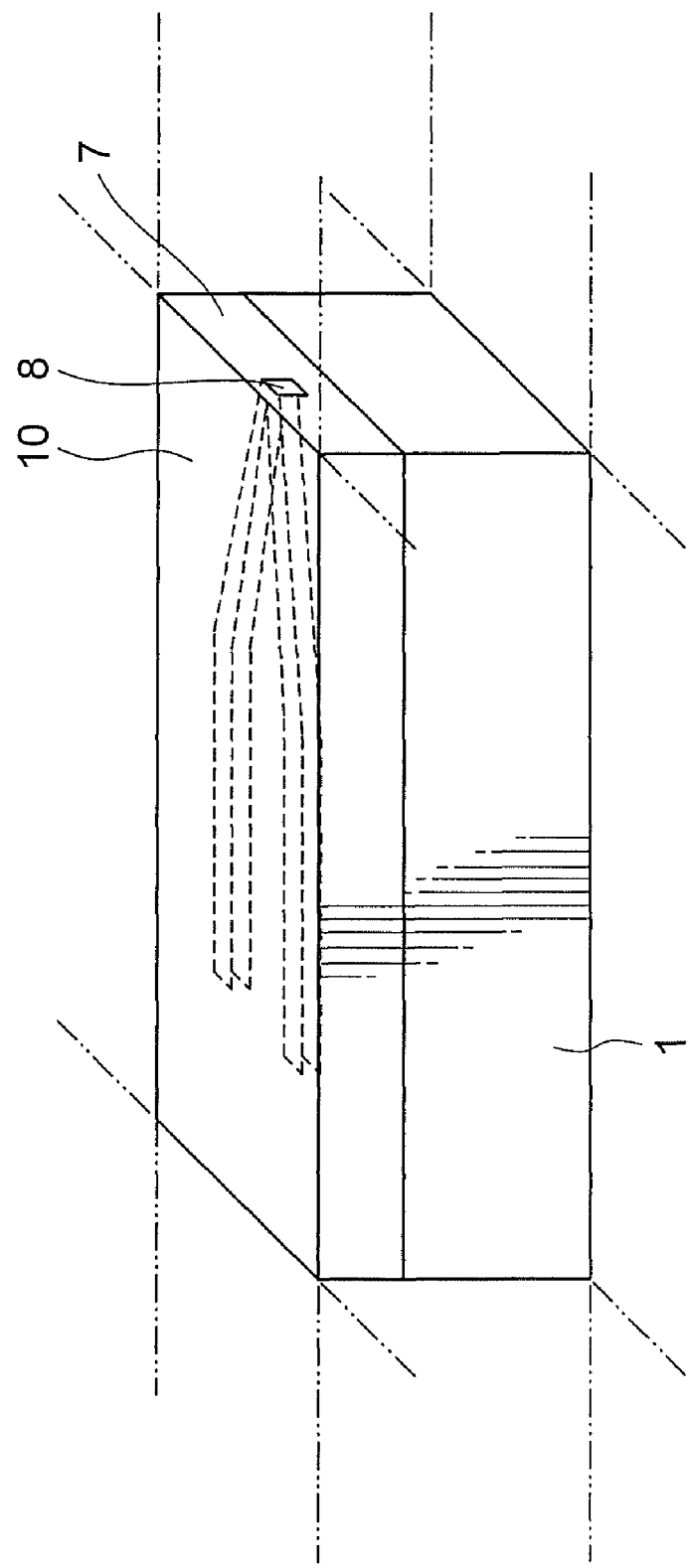
FIG. 5 is an illustration for describing a V-letter type waveguide forming step 3 (an upper clad layer forming step) in the flowchart of FIG. 2 that shows the procedure for manufacturing the bidirectional optical transmitting/receiving module.

Then, as shown in FIG. 5, PSG (phosphorous-added silica glass) is deposited to form the upper clad layer 10 (refractive index n3), and the V-letter shaped waveguide 2 is formed inside thereof (V-letter shaped optical waveguide forming step C: upper clad layer forming step, step S103).

Figure 6:
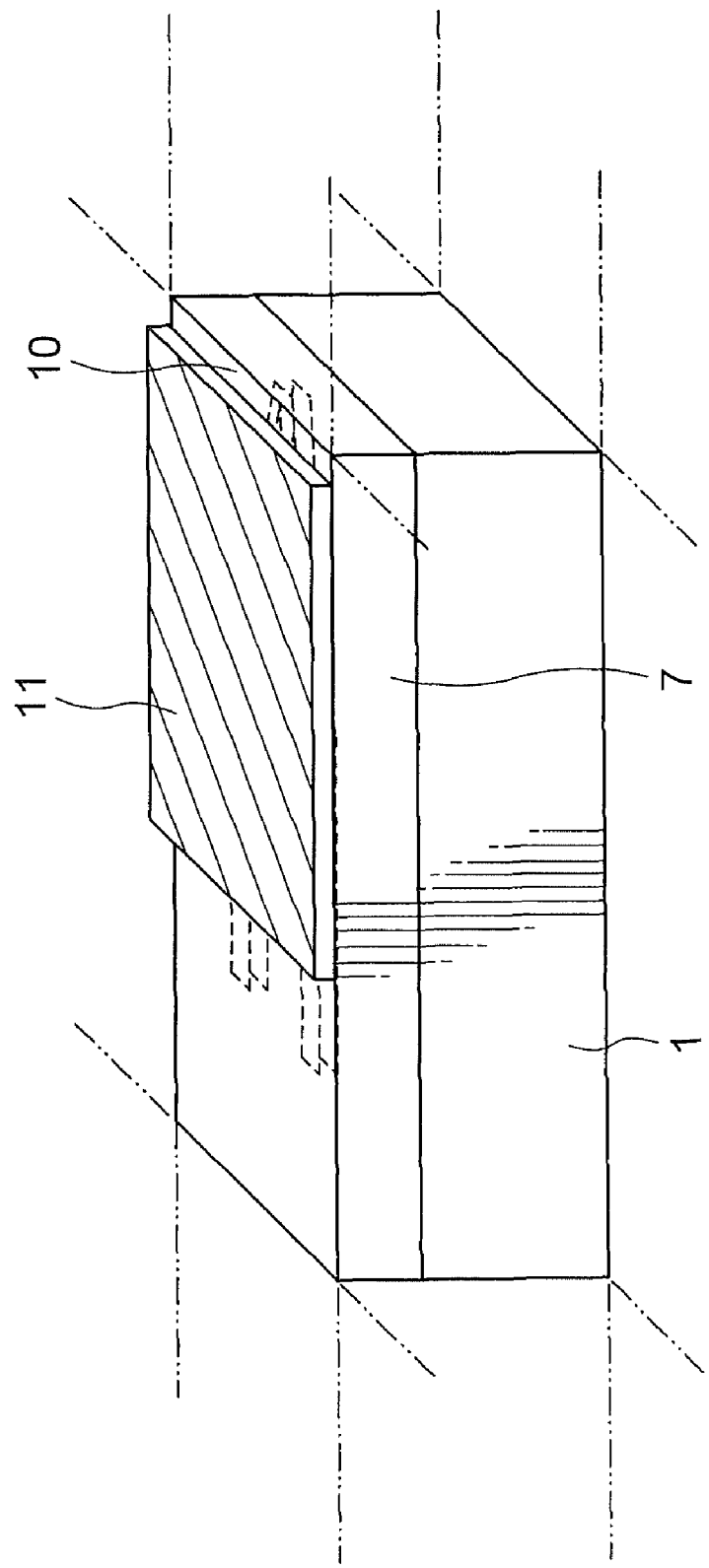
FIG. 6 is an illustration for describing an end face forming step 1 (a resist pattern forming step) in the flowchart of FIG. 2 that shows the procedure for manufacturing the bidirectional optical transmitting/receiving module.
Figure 7:
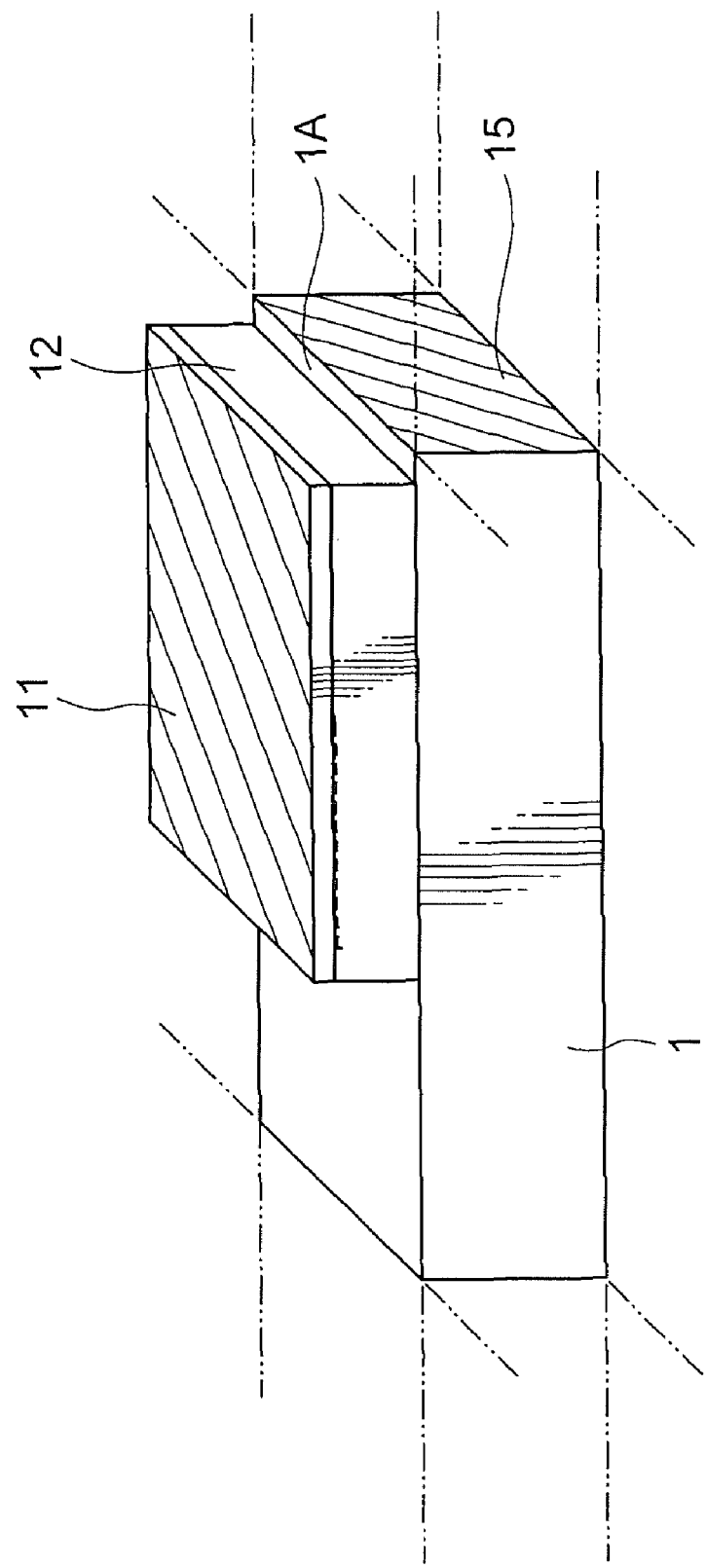
FIG. 7 is an illustration for describing an end face forming step 2 (an etching step) in the flowchart of FIG. 2 that shows the procedure for manufacturing the bidirectional optical transmitting/receiving module.

Then, as shown in FIG. 6 and FIG. 7, a perpendicular end face is formed to the upper clad layer 10 at the positions where the semiconductor laser 4 and the optical fiber 6 are to be formed so that the semiconductor laser 4 and the optical fiber 6 can be optically coupled to the V-letter shaped optical waveguide 2, respectively. At the same time, a perpendicular end face is also formed at the intersection part of the V-letter shaped optical waveguide 2 for forming the dielectric multilayer filter 3 (end face forming step).

That is, FIG. 6 shows a forming step of a resist pattern B11 used for the etching mask (end face forming step A—resist pattern forming step, step S104). Further, FIG. 7 shows a forming step of the end face described above through dry-etching the upper clad layer 10 to the top face of the Si substrate 1 by using the resist pattern B11 as the etching mask (end face forming step 2—etching step, step S105). Through these steps, obtained is the end face for optically coupling the semiconductor laser 4 and the optical fiber 6 to the V-letter shaped optical waveguide 2, as well as the smooth end face 12 where the dielectric multilayer filter 3 is to be formed.

Figure 8:
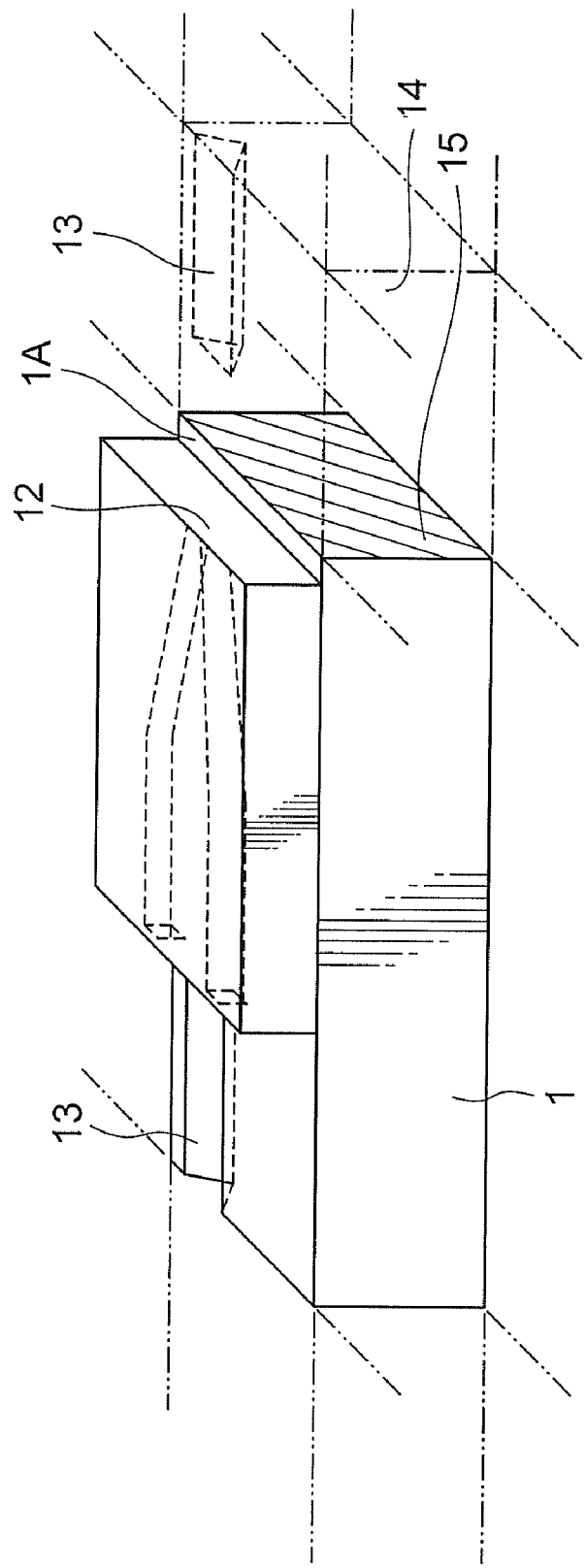
FIG. 8 is an illustration for describing a V-section groove forming step in the flowchart of FIG. 2 that shows the procedure for manufacturing the bidirectional optical transmitting/ receiving module.

Next, as shown in FIG. 8, the resist pattern B11 is removed, and a groove 13 including a V-letter shaped section is formed so that the optical fiber 6 can be arranged at a proper position (V-sectioned groove forming step, step S106). In FIG. 8, a cutting margin 14 of the Si substrate is illustrated for describing a step structure between the smooth end face 12 according to the exemplary embodiment and the cutting face of the Si substrate 1.

Figure 9:
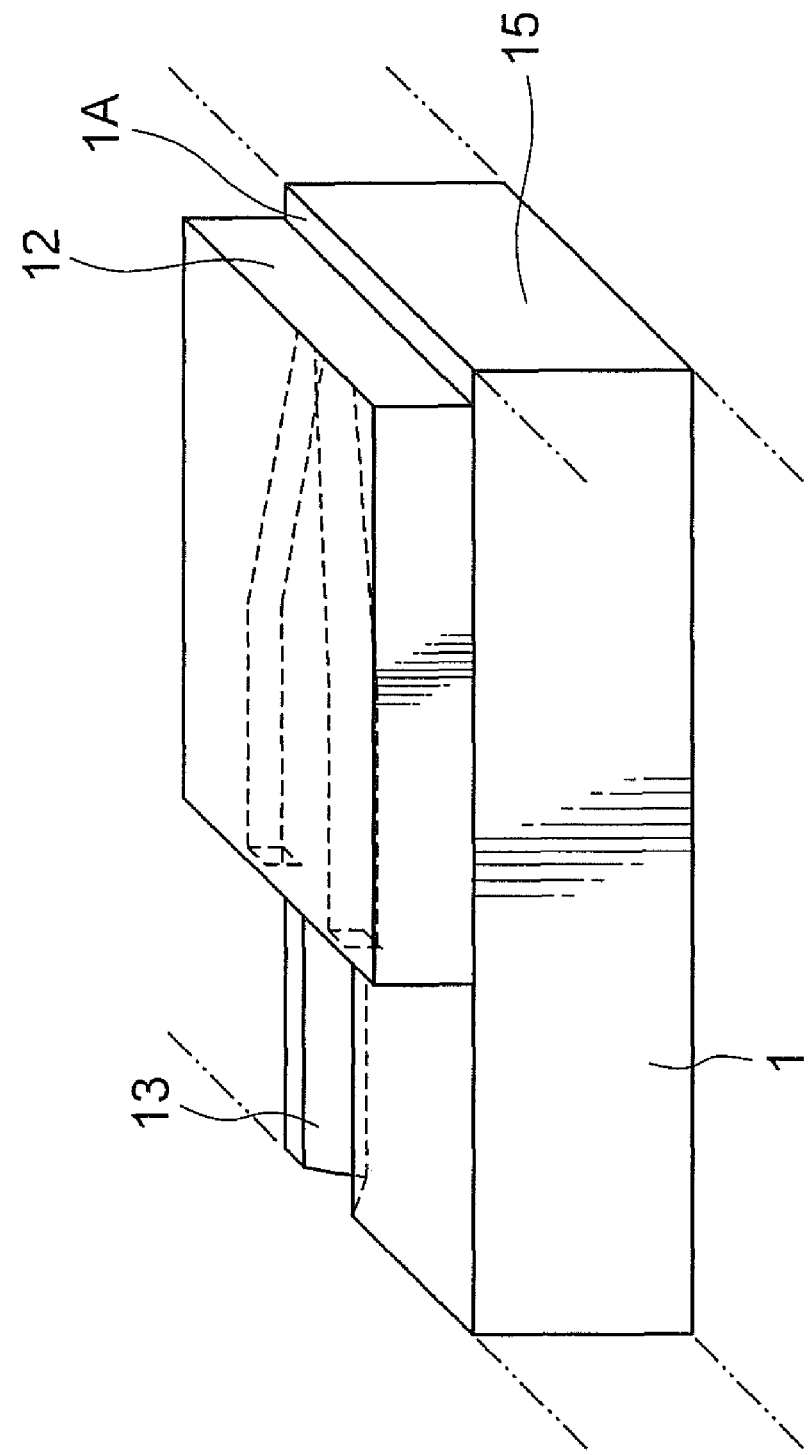
FIG. 9 is an illustration for describing an optical module longitudinal direction separating step in the flowchart of FIG. 2 that shows the procedure for manufacturing the bidirectional optical transmitting/receiving module.

Next, as shown in FIG. 9, the bidirectional optical transmitting/receiving modules formed collectively on a wafer are separated in a perpendicular direction (referred to as a "longitudinal direction" herein) with respect to the intersection part of the V-letter shaped optical waveguide so that a plurality of the bidirectional optical transmitting/receiving modules are connected in line in a lateral direction in a bar state. At this time, the bidirectional optical transmitting/receiving modules are separated at a cutting face A15 at a position where there is a step structure of at least 3 μm, so that the smooth end face 12 described above is not damaged by dicing (optical module longitudinal direction cutting step, step S107). In this separating step, it is necessary to reach the depth of about 1 mm. Therefore, a method employing only dry etching is not practical in terms of the productivity.

Figure 10:
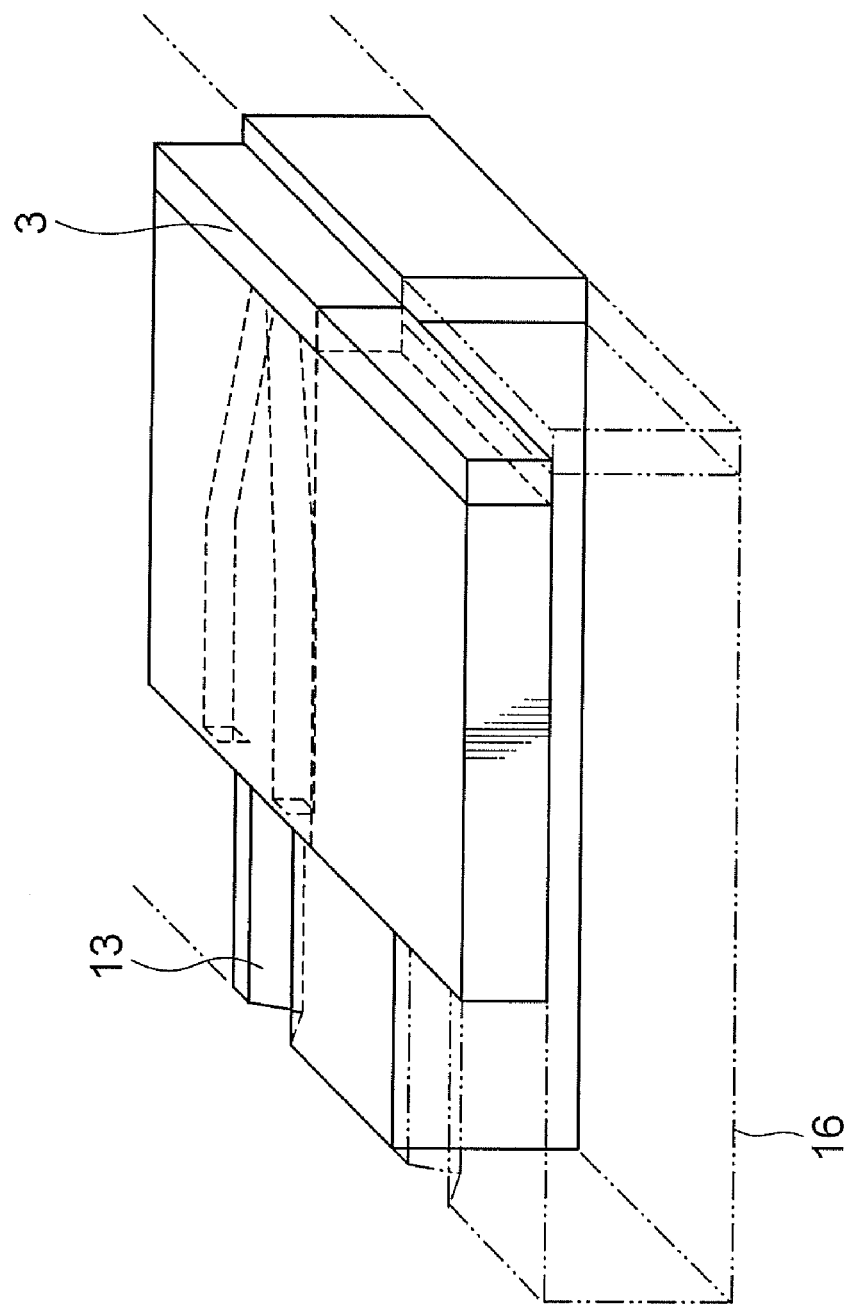
FIG. 10 is an illustration for describing a dielectric multilayer film forming step in the flowchart of FIG. 2 that shows the procedure for manufacturing the bidirectional optical transmitting/receiving module.

Next, as shown in FIG. 10, the dielectric multilayer filter 3 is formed on the smooth end face 12 by a known method, sputtering (dielectric multilayer film forming step, step S108). Normally, this step is executed while a plurality of the optical modules are lined in the lateral direction in a bar state. Thus, for clearly illustrating this state, an optical module 16 lined next in the lateral direction is illustrated in the drawing.

Figure 11:
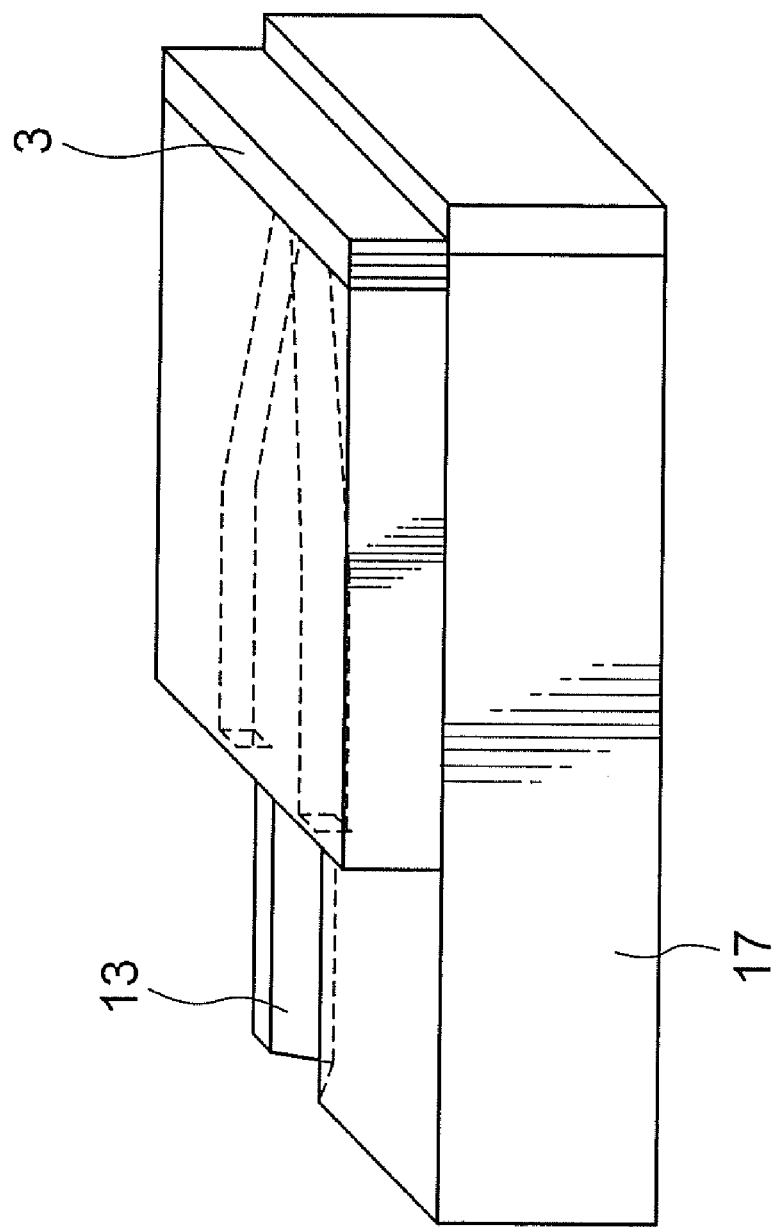
FIG. 11 is an illustration for describing an optical module lateral direction separating step in the flowchart of FIG. 2 that shows the procedure for manufacturing the bidirectional optical transmitting/receiving module.

Next, as shown in FIG. 11, the optical modules in a bar state are separated into each piece by performing dicing in the "lateral direction" (optical module lateral direction dicing step, step S109). At this time, if a cutting face B17 intersects with the dielectric multilayer filter 3, chip-off and exfoliation of the dielectric multilayer filter 3 may be induced, thereby resulting in deteriorations in the yield and reliability. Thus, it is desirable for the above-described smooth end face 12 to be separated from the cutting face B17. Therefore, it is desirable in the above-described etching step (step S105) for forming the end face to etch also the upper clad layer and the like at the boundary between the neighboring optical modules in the lateral direction.

Figure 12:
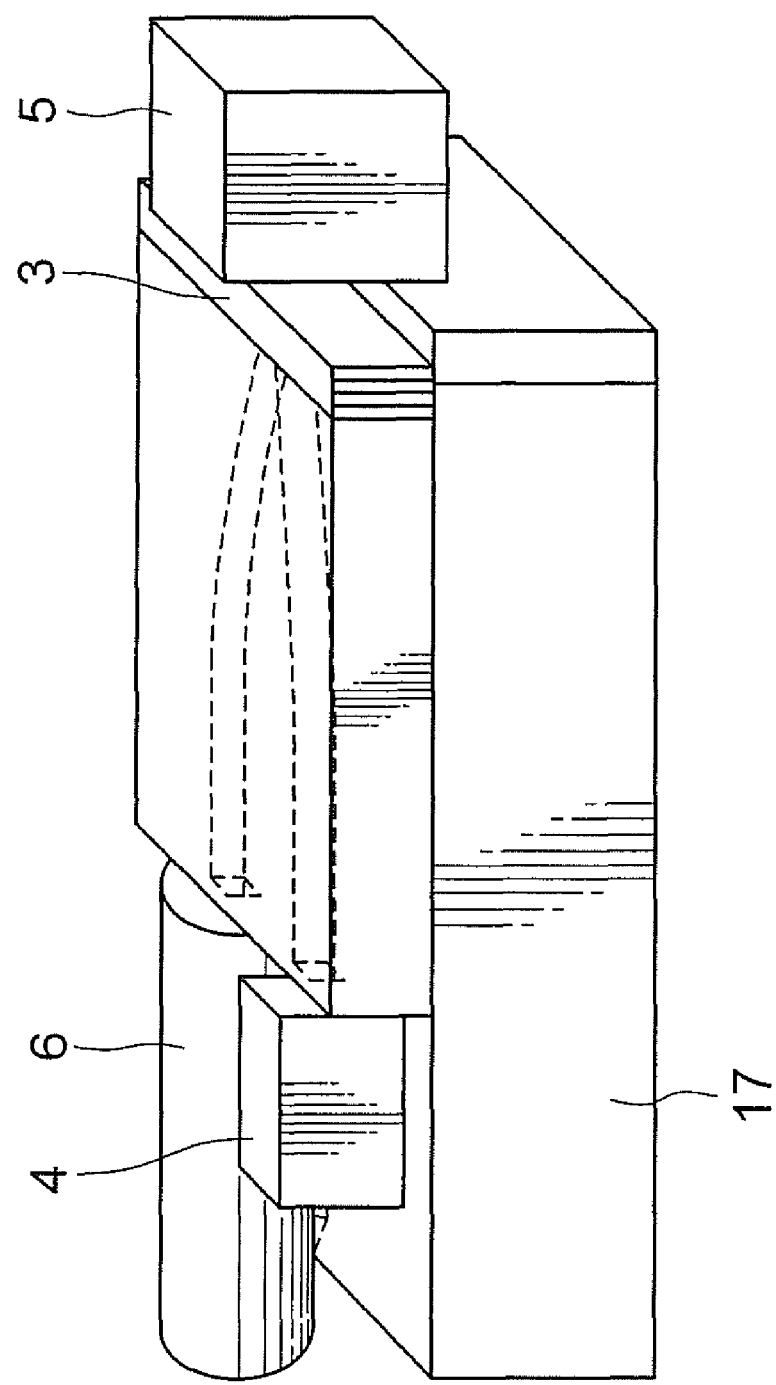
FIG. 12 is an illustration for describing an element disposing step for disposing a light emitting element and the like in the flowchart of FIG. 2 that shows the procedure for manufacturing the bidirectional optical transmitting/receiving module.

At last, as shown in FIG. 12, the semiconductor laser 4, the photodiode 5, and the optical fiber 6 are disposed at prescribed positions (element disposing step, step S110), thereby completing the bidirectional optical transmitting/receiving module according to the exemplary embodiment which utilizes the de-multiplexing characteristic of the dielectric multilayer filter 3. The semiconductor laser 4, the photodiode 5, and the like are electrically connected as appropriate, while details of the electric wirings for the semiconductor laser 4, the photodiode, and the like are omitted because it is not the point that the present invention is directed to.

Further, it is also possible to collectively form the dielectric multilayer filter 3 part in a state of the wafer 18 as in FIG. 13, through controlling the depth of etching, i.e. performing sufficiently deep etching at the time of forming the smooth end face 12 or stopping dicing performed in parallel to the end face 12 when reaching at a proper depth in FIG. 8.

As a first effect of the above-described manufacturing method, it is possible to form the highly smooth end face and the dielectric multilayer filter by the dry etching step that is separated from the optical module longitudinal direction separating step. Thus, it becomes possible to provide the bidirectional optical transmitting/receiving module having an excellent de-multiplexing characteristic.

Furthermore, because the cutting margin for dicing does not make a contact with the above-described dielectric multilayer filter at the time of the optical module lateral direction separating step, deteriorations in the reliability caused due to exfoliation and chip-off of the dielectric multilayer filter 3 can be prevented. This makes it possible to manufacture the highly reliable bidirectional optical transmitting/receiving modules with high yields.

Figure 13A:
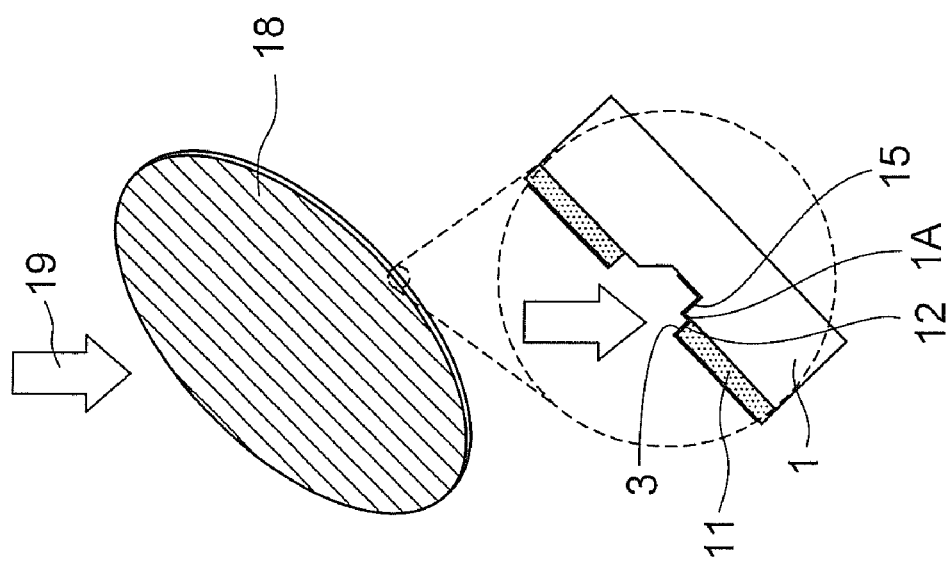
FIG. 13 is an illustration for describing an example of a manufacturing method which collectively forms a dielectric multilayer film in a wafer state on the smooth end face disclosed in FIG. 7 and FIG. 8.
Figure 13B:
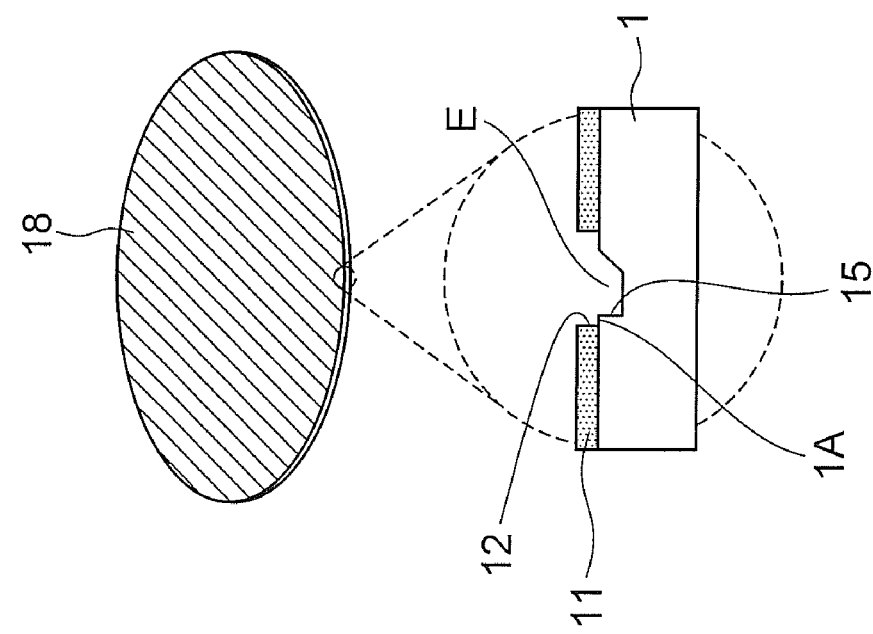

Further, in the above, it is described that the dielectric multilayer filter 3 is formed while the optical modules are separated in the longitudinal direction to be formed into a bar state. However, as shown in FIG. 13A and FIG. 13B, it is also possible to form the dielectric multilayer film 3 collectively on the optical waveguide forming wafer 18.

For this, in the above-described manufacturing steps, following procedure may be executed to form a multilayer thin film collectively on the wafer while the optical module substrate 1 is not being separated. That is, at the time of etching for forming the smooth end face 12 shown in FIG. 7, sufficiently deep etching E is performed for forming the end face 12 and the end face 15 to the optical waveguide forming wafer 18 as in FIG. 13A. Then, as shown in FIG. 13B, a multilayer film raw material flow 19 is deposited on the wafer 18 in a tilted state to which the sufficient etching has been performed so as to form the dielectric multilayer filter 3 over the end face 12, the end face 15, and an etching part E. Thereafter, the dicing step shown in FIG. 9 is not performed or the dicing performed in parallel to the end face 12 is stopped when reaching at a proper depth in the "optical module longitudinal direction separating step (step S107)" that is shown in FIG. 9, so that the multilayer thin film is formed collectively on the wafer under a state where the optical module substrate 1 is not being separated.

With this, the dielectric multilayer filter can be formed by performing collective processing on the wafer. This provides such an effect that transportation, setting, and the like of the bar-type optical modules at the time of manufacture can be simplified.

(Regarding Bidirectional Optical Transmitting/Receiving Device 40)

Figure 14:
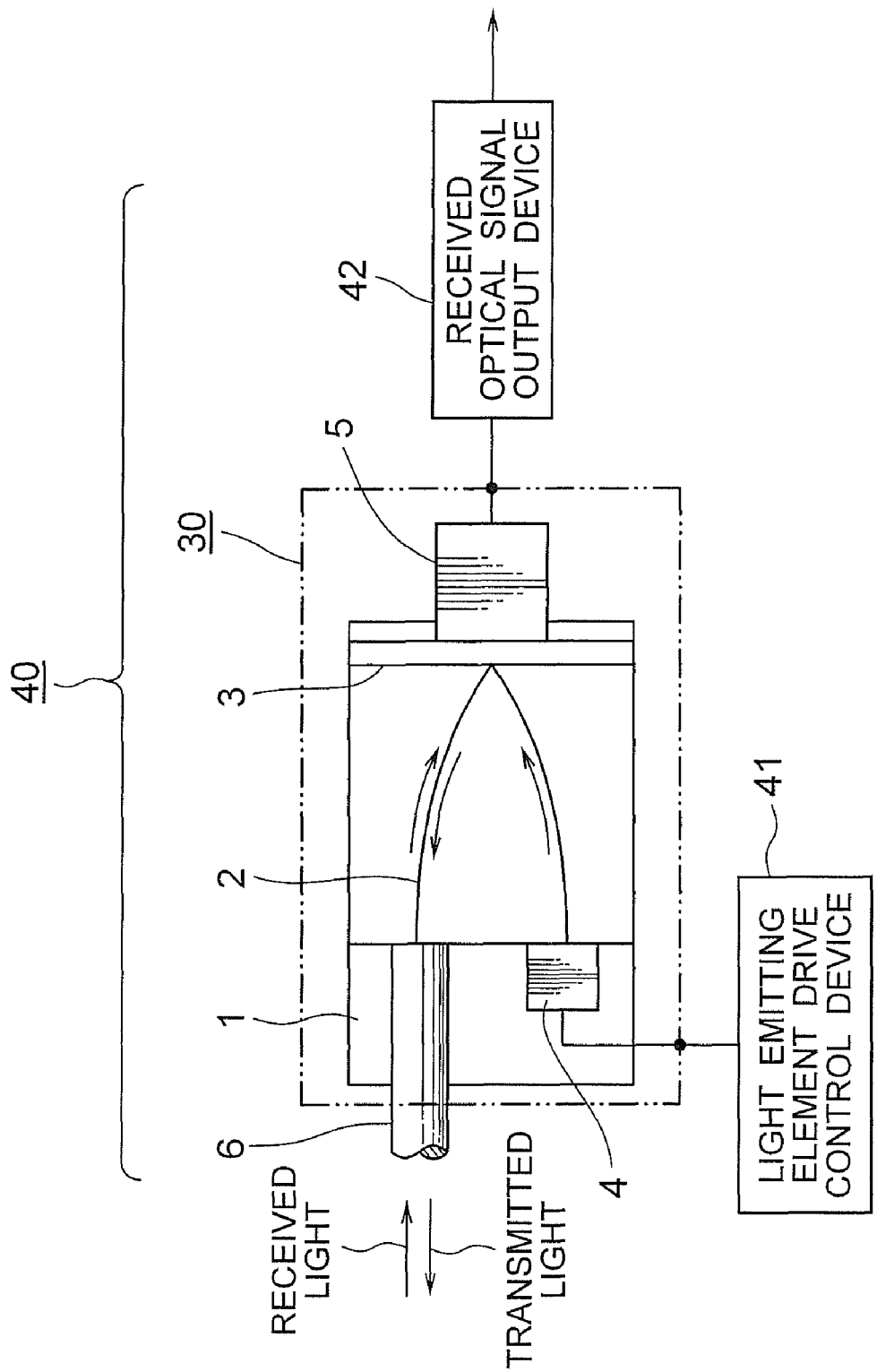
FIG. 14 is an illustration for describing an example of an optical transmitting/receiving device including the bidirectional optical transmitting/receiving module as a main component.

The bidirectional optical transmitting/receiving module 30 described above is practically used as a bidirectional optical transmitting/receiving device 40 that is shown in FIG. 14.

This bidirectional optical transmitting/receiving device 40 includes: the above-described bidirectional optical transmitting/receiving module 30; a light emitting element drive control device 41 for drive-controlling, with transmission electric signals from the outside, the light emitting element (semiconductor laser) 4 that is provided to the bidirectional optical transmitting/receiving module 30; and a received signal output device 42 for outputting, towards the outside, received signals that are photoelectrically converted by the photodiode 5 that is the light receiving element.

Thus, the light emitting element (semiconductor laser) 4 is controlled and operated by the light emitting element drive control device 41, so that it becomes possible to send out prescribed communication transmitted light to the optical fiber 6 via the above-described V-letter shaped optical waveguide 2. In the meantime, the received light received from the outside via the optical fiber 6 is introduced via the V-letter shaped optical waveguide 2, sent to the light receiving element (photodiode) 5 via the dielectric multilayer filter 3, converted to an electric signal, and sent to the outside. Through this, bidirectional optical transmission and reception can be accomplished.

In this bidirectional optical transmitting/receiving device 40, the main component is also the bidirectional optical transmitting/receiving module 30 that is improved therein. Since the bidirectional optical transmitting/receiving module 30 has the smooth end face, the dielectric multilayer filter formed thereon has a high-performance de-multiplexing characteristic. Therefore, it is possible to provide the high-performance bidirectional optical transmitting/receiving module with which the transmitted light is not mixed with the received light. Further, it is also possible to provide the bidirectional optical transmitting/receiving device using such module, and to provide the simple-structured and low-cost manufacturing method of the bidirectional optical transmitting/receiving module stably.

Next, another exemplary embodiment of the present invention will be described.

Figure 15A:
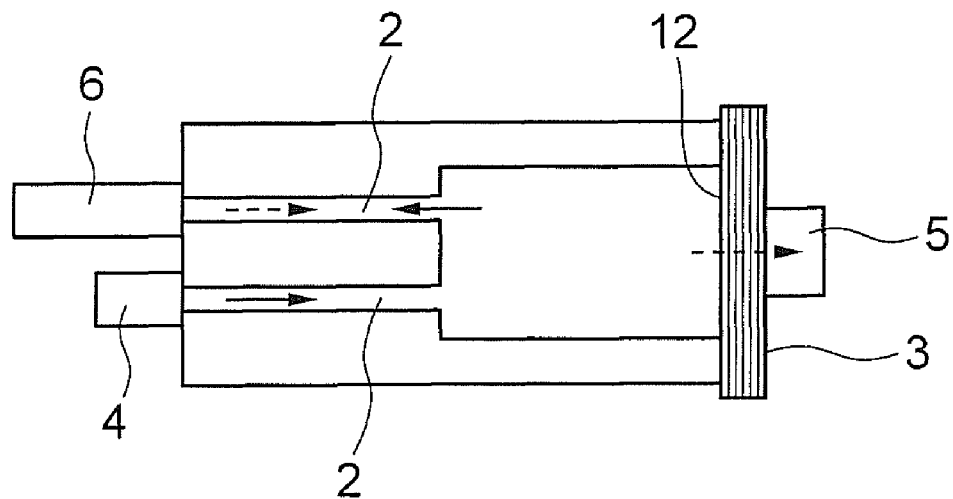
FIG. 15 is a plan view showing another example of a bidirectional optical waveguide used in an embodiment of the present invention.
Figure 15B:
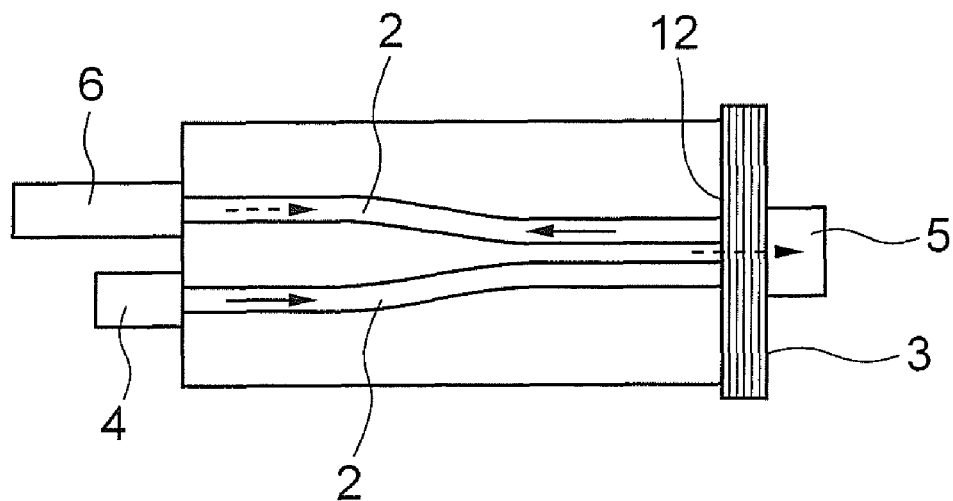
Figure 17A:
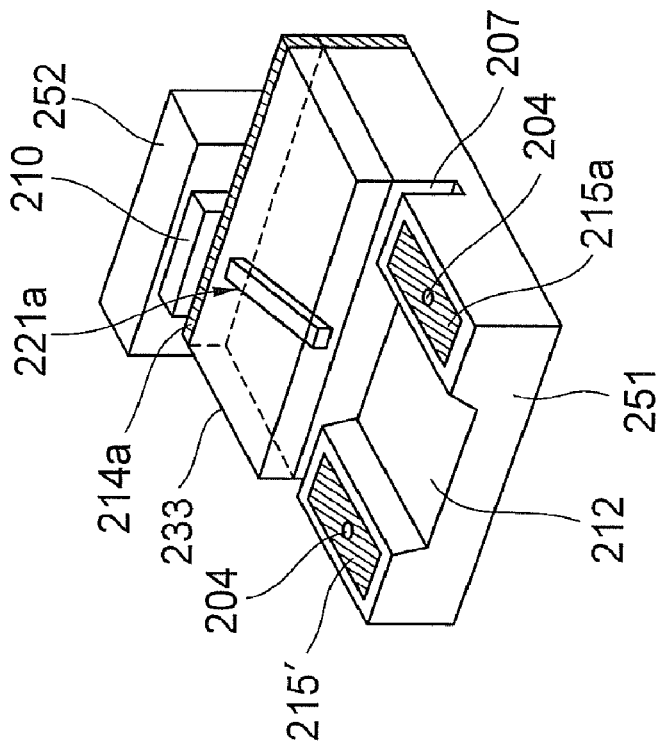
FIG. 17 is a perspective view showing an example of another related technique.
Figure 17B:
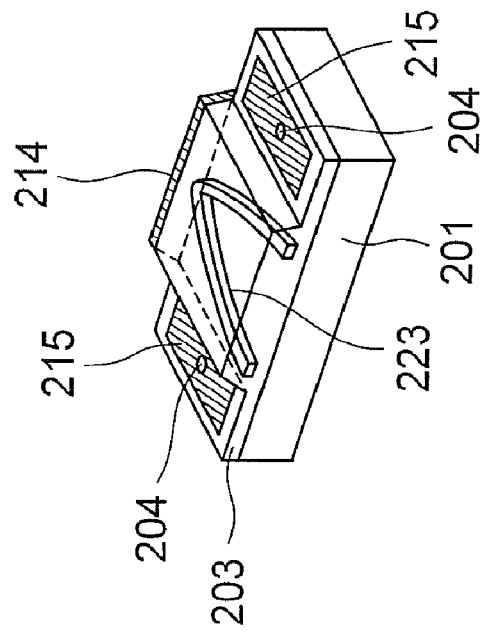

As shown in FIG. 1, in the embodiment described above, the V-letter shaped optical waveguide is used as the bidirectional optical waveguide 2, and the intersection part is formed as a folded structure. However, the present invention is not limited only to that. The folded structure herein means a structure that has a function of de-multiplexing optical signals of two wavelengths. Instead of the V-letter shaped optical waveguide 2, the bidirectional optical waveguide 2 shown in FIG. 15A and FIG. 15B may also be used. As the bidirectional optical waveguide 2 shown in FIG. 15A, a multi-mode interference type (MMI) optical waveguide may be used. The multi-mode interference type optical waveguide 2 shown in FIG. 15A includes a filter 3 on a folded-structured end face 12, and the folded-structured end face 12 is disposed at a position recessed to the inner side with respect to the end face of the substrate 1. As the bidirectional optical waveguide 2 shown in FIG. 15B, a directional-coupling (DC) type optical waveguide may be used. The directional-coupling type optical waveguide 2 shown in FIG. 15B includes the filter 3 on the folded-structured end face 12, and the folded-structured end face 12 is disposed at a position recessed to the inner side with respect to the end face of the substrate 1.

Further, a bidirectional optical transmitting/receiving module according to another embodiment of the invention may include, for performing simultaneous bidirectional communications with light of two wavelengths by using a single-core optical fiber: a light emitting element; a light receiving element; a V-letter shaped optical waveguide formed on a substrate; and a dielectric multilayer filter formed on an end face at intersection part of the V-letter shaped optical waveguide, which reflects light from the light emitting element, and transmits received light and guides it to the light receiving element, wherein: the end face is formed by etching; a step structure is provided between the end face and a dicing face of the substrate for preventing a dicing tool from making a contact with the end face at the time of dicing; and the dielectric multilayer film of the light receiving element is formed on the end face.

Therefore, unlike the method which simultaneously performs dicing of the substrate and forming of the end face, the end face can be formed smoothly by etching. In addition, the step structure is formed so that the dicing tool does not have a contact with the end face at the time of dicing the substrate, thereby preventing the dicing tool from making a contact with the end face at the time of dicing. Therefore, it is possible for the end face to effectively avoid having roughness generated thereon at the time of the processing, so that adverse affects imposed upon the de-multiplexing characteristic can be avoided. As a result, it becomes possible to form a high-quality dielectric multilayer film, so that a desired de-multiplexing characteristic can be obtained stably with a simple-structured and low-cost manufacturing method.

A bidirectional optical transmitting/receiving module manufacturing method according to another embodiment of the invention may include: a step of forming a V-letter shaped optical waveguide on a substrate; an end face forming step for forming, by etching, an end face that is perpendicular to the V-letter shaped optical waveguide at an intersection part of the V-letter shaped optical waveguide; a dicing step for performing dicing of another bidirectional optical transmitting/receiving module from the substrate at a position isolated by a step structure for preventing a dicing tool from making a contact with the end face; and a dielectric multilayer film forming step for forming, on the end face, a dielectric multilayer film which reflects a transmitted light wavelength and transmits a received light wavelength.

A bidirectional optical transmitting/receiving module manufacturing method according to still another embodiment of the invention may include: a waveguide forming step for forming a V-letter shaped optical waveguide on a substrate; an end face forming step for forming, by etching, an end face that is perpendicular to the formed V-letter shaped optical waveguide at an intersection part of the V-letter shaped optical waveguide; a dielectric multilayer film forming step for forming, on the end face by wafer collective processing, the dielectric multilayer film which reflects transmitted light wavelength and transmits received light wavelength; and a dicing processing step for performing dicing processing on the substrate at a position that is extruded towards the outer side from the end face and is also on the same flank of the end face.

With this, the dielectric multilayer thin film filter can be formed by performing collective processing on the wafer. This provides such an advantage that transportation, setting, and the like of the bar-type optical transmitting/receiving modules at the time of manufacture can be simplified. The method may be structured such that: only slight dicing is performed in the above-described dicing processing step to such an extent that the substrate is not separated; the dielectric multilayer film is formed by performing wafer collective processing in the dielectric multilayer film forming step; and a complete separation step is executed thereafter.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A bidirectional optical transmitting/receiving module, comprising:
    a light emitting element for performing simultaneous bidirectional communications with light of two wavelengths by using a single-core optical fiber;
    a bidirectional V letter-shaped optical waveguide which is formed on a substrate and coupled to the light emitting element; and
    a dielectric multilayer filter formed on a folded-structured end face of the V letter-shaped optical waveguide, the dielectric multilayer filter having a characteristic of reflecting transmitted light from the light emitting element and a characteristic of transmitting received light from outside, wherein
    the folded-structured end face of the V letter-shaped optical waveguide is disposed at a position receded to an inner side with respect to an end face of the substrate,
    the substrate has a step structure having a width formed by the folded-structured end face of the V letter-shaped optical wave guide and the end face of the substrate,
    the folded-structured end face of the V letter-shaped optical waveguide is formed smoothly by etching,
    the end face of the substrate is form by dicing at a position shifted from the folded-structured end face of the V letter-shaped optical waveguide by the width of the step structure, and
    the dielectric multilayer filter is formed on the folded-structured end face of the V letter-shaped optical waveguide and on the step structure of the substrate.

2. The bidirectional optical transmitting/receiving module as claimed in claim 1, wherein the folded-structured end face of the optical waveguide is formed by etching, and the end face of the substrate is formed by dicing.

3. The bidirectional optical transmitting/receiving module as claimed in claim 1, wherein the folded-structured end face of the optical waveguide and the end face of the substrate are formed by etching.

4. The bidirectional optical transmitting/receiving module as claimed in claim 1, wherein the folded-structured end face of the optical waveguide and the end face of the substrate are shifted from each other by a distance of at least 3 µm.

5. A bidirectional optical transmitting/receiving device, comprising:
 a bidirectional optical transmitting/receiving module;
 a light emitting element drive control device for drive-controlling, with a transmission electric signal from outside, a light emitting element that inputs an optical signal to the bidirectional optical transmitting/receiving module; and
 a received signal output device for outputting, to the outside, a received signal that is obtained by photoelectrically converting the optical signal received at a light receiving element from the bidirectional optical transmitting/receiving module, wherein
 the bidirectional optical transmitting/receiving module comprises:
 a light emitting element for performing simultaneous bidirectional communications with light of two wavelengths by using a single-core optical fiber;
 a bidirectional V letter-shaped optical waveguide which is formed on a substrate and coupled to the light emitting element; and
 a dielectric multilayer filter formed on a folded-structured end face of the V letter-shaped optical waveguide, the dielectric multilayer filter having a characteristic of reflecting transmitted light from the light emitting element and a characteristic of transmitting received light from outside, wherein
 the folded-structured end face of the V letter-shaped optical waveguide is disposed at a position receded to an inner side with respect to an end face of the substrate,
 the substrate has a step structure having a width formed by the folded-structured end face of the V letter-shaped optical wave guide and the end face of the substrate,
 the folded-structured end face of the V letter-shaped optical waveguide is formed smoothly by etching,
 the end face of the substrate is form by dicing at a position shifted from the folded-structured end face of the V letter-shaped optical waveguide by the width of the step structure, and
 the dielectric multilayer filter is formed on the folded-structured end face of the V letter-shaped optical waveguide and on the step structure of the substrate.

6. A bidirectional optical transmitting/receiving device, comprising:
 a bidirectional optical transmitting/receiving module;
 a light emitting element drive control means for drive-controlling, with a transmission electric signal from outside, a light emitting element that inputs an optical signal to the bidirectional optical transmitting/receiving module; and
 a received signal output means for outputting, to the outside, a received signal that is obtained by photoelectrically converting the optical signal received at a light receiving element from the bidirectional optical transmitting/receiving module, wherein
 the bidirectional optical transmitting/receiving module comprises:
 a light emitting element for performing simultaneous bidirectional communications with light of two wavelengths by using a single-core optical fiber;
 a bidirectional V letter-shaped optical waveguide which is formed on a substrate and coupled to the light emitting element; and
 a dielectric multilayer filter formed on a folded-structured end face of the V letter-shaped optical waveguide, the dielectric multilayer filter having a characteristic of reflecting transmitted light from the light emitting element and a characteristic of transmitting received light from outside, wherein
 the folded-structured end face of the V letter-shaped optical waveguide is disposed at a position receded to an inner side with respect to an end face of the substrate,
 the substrate has a step structure having a width formed by the folded-structured end face of the V letter-shaped optical wave guide and the end face of the substrate,
 the folded-structured end face of the V letter-shaped optical waveguide is formed smoothly by etching,
 the end face of the substrate is form by dicing at a position shifted from the folded-structured end face of the V letter-shaped optical waveguide by the width of the step structure, and
 the dielectric multilayer filter is formed on the folded-structured end face of the V letter-shaped optical waveguide and on the step structure of the substrate.

7. A bidirectional optical transmitting/receiving module manufacturing method, the method successively comprising:
 forming a bidirectional V letter-shaped optical waveguide on a substrate, the substrate part of the module, the module adapted to perform simultaneous bidirectional communications with light of two wavelengths by using a single-core optical fiber in combination with a light emitting element, a light receiving element, and the bidirectional V letter-shaped optical waveguide;
 etching a folded structure of the bidirectional optical waveguide to form a folded-structured end face of the V letter-shaped optical waveguide by etching at a position that is receded to an inner side from an end face of the substrate, such that the folded-structured end face is formed smoothly; and
 cutting the end face of the substrate by dicing while leaving a step structure between the folded-structured end face of the V letter-shaped optical waveguide and the end face of the substrate.

8. The bidirectional optical transmitting/receiving module manufacturing method as claimed in claim 7, wherein the folded-structured end face of the optical waveguide and the end face of the substrate are formed by etching.

9. The bidirectional optical transmitting/receiving module manufacturing method as claimed in claim 7, comprising: forming a dielectric multilayer film on the folded-structured end face of the optical waveguide for reflecting a transmitted light wavelength and transmits a received light wavelength.

10. The bidirectional optical transmitting/receiving module manufacturing method as claimed in claim 9, wherein the dielectric multilayer film is formed on the end face by applying etching processing or dicing processing to such an extent that the substrate is not separated.

11. The bidirectional optical transmitting/receiving module manufacturing method as claimed in claim 10, wherein:
 the folded-structured end face of the bidirectional V letter-shaped optical waveguide and the end face of the substrate are formed by etching the substrate; and the dielectric multilayer film is formed on the folded-structured end face of the bidirectional V letter-shaped optical waveguide by forming the dielectric film at a portion where the etching has been performed, while the substrate is being tilted.

12. The bidirectional optical transmitting/receiving module manufacturing method as claimed in claim 11, wherein the etching and the formation of the dielectric multilayer film are performed on a wafer having a plurality of the bidirectional optical transmitting/receiving modules formed on the substrate.

13. A bidirectional optical transmitting/receiving module manufacturing method, the method successively comprising:

forming a bi-directional optical waveguide on a substrate, the substrate part of the bidirectional optical transmitting/receiving module, the module adapted to perform simultaneous bidirectional communications with light of two wavelengths by using a single-core optical fiber in combination with a light emitting element, a light receiving element, and the bidirectional optical waveguide, the waveguide including a core layer and a clad layer surrounding the core layer;

forming a folded-structured end face of the bi-directional optical waveguide by etching, by removing the core layer and the clad layer to a top face of the substrate through etching, while leaving a step structure on the top face of the substrate, such that the folded-structured end face is formed smoothly; and, cutting the substrate at an end portion of the step structure by dicing to form a dielectric multilayer film having a characteristic of reflecting transmitted light from the light emitting element and a characteristic of transmitting received light from outside on the folded-structured end face of the bidirectional optical waveguide on the step structure.

* * * * *